(12) United States Patent
Lee et al.

(10) Patent No.: US 7,724,772 B2
(45) Date of Patent: *May 25, 2010

(54) METHOD AND APPARATUS FOR SWITCHING DATA IN COMMUNICATION SYSTEM

(75) Inventors: Chen-Yi Lee, Hsin-Chu (TW); Chih-Hao Liu, Hsin-Dian (TW); Chien-Ching Lin, Shui-Shang Town (TW); Hsie-Chia Chang, Keelung (TW); Yar-Sun Hsu, Chung-Ho (TW)

(73) Assignee: National Chiao Tung University, Hsin-Chu (TW)

( * ) Notice: Subject to any disclaimer, the term of this patent is extended or adjusted under 35 U.S.C. 154(b) by 378 days.

This patent is subject to a terminal disclaimer.

(21) Appl. No.: 11/802,028

(22) Filed: May 18, 2007

(65) Prior Publication Data

US 2008/0198843 A1 Aug. 21, 2008

(51) Int. Cl.
*H04J 3/16* (2006.01)
(52) U.S. Cl. .................. 370/466; 370/503; 375/354
(58) Field of Classification Search ......... 370/465–466, 370/503–516; 375/354; 714/746–747, 775–785
See application file for complete search history.

(56) References Cited

U.S. PATENT DOCUMENTS

2005/0180310 A1* 8/2005 Mueller et al. .............. 370/204

* cited by examiner

*Primary Examiner*—Ricky Ngo
*Assistant Examiner*—Pao Sinkantarakorn
(74) *Attorney, Agent, or Firm*—Birch, Stewart, Kolasch & Birch, LLP

(57) ABSTRACT

A method and apparatus for switching data in communication system which comprises of mainly a conversion circuit to receive source data possessing real coding dimension and covert it to converted data possessing tolerable coding dimension; judgment bit is set in the converted data to designate the data as source data or not. Later on, shift circuit is used to shift the converted data in certain amount so as to generate a shifted data; meanwhile, the lowest bit and highest bit of shifted data are used to start acquiring real coding dimension to be used respectively as a first data and a second data, or by changing the pattern of acquiring the first data, then the highest bit minus the real coding dimension bit as the starting bit of the first data, and acquiring the real coding dimension from the side of the lowest bit. Finally, a comparison and selection circuit is used to compare the corresponding judgment bit in the first and the second data and to output an output data, wherein output data is source data with the above-mentioned amount of shift.

14 Claims, 12 Drawing Sheets

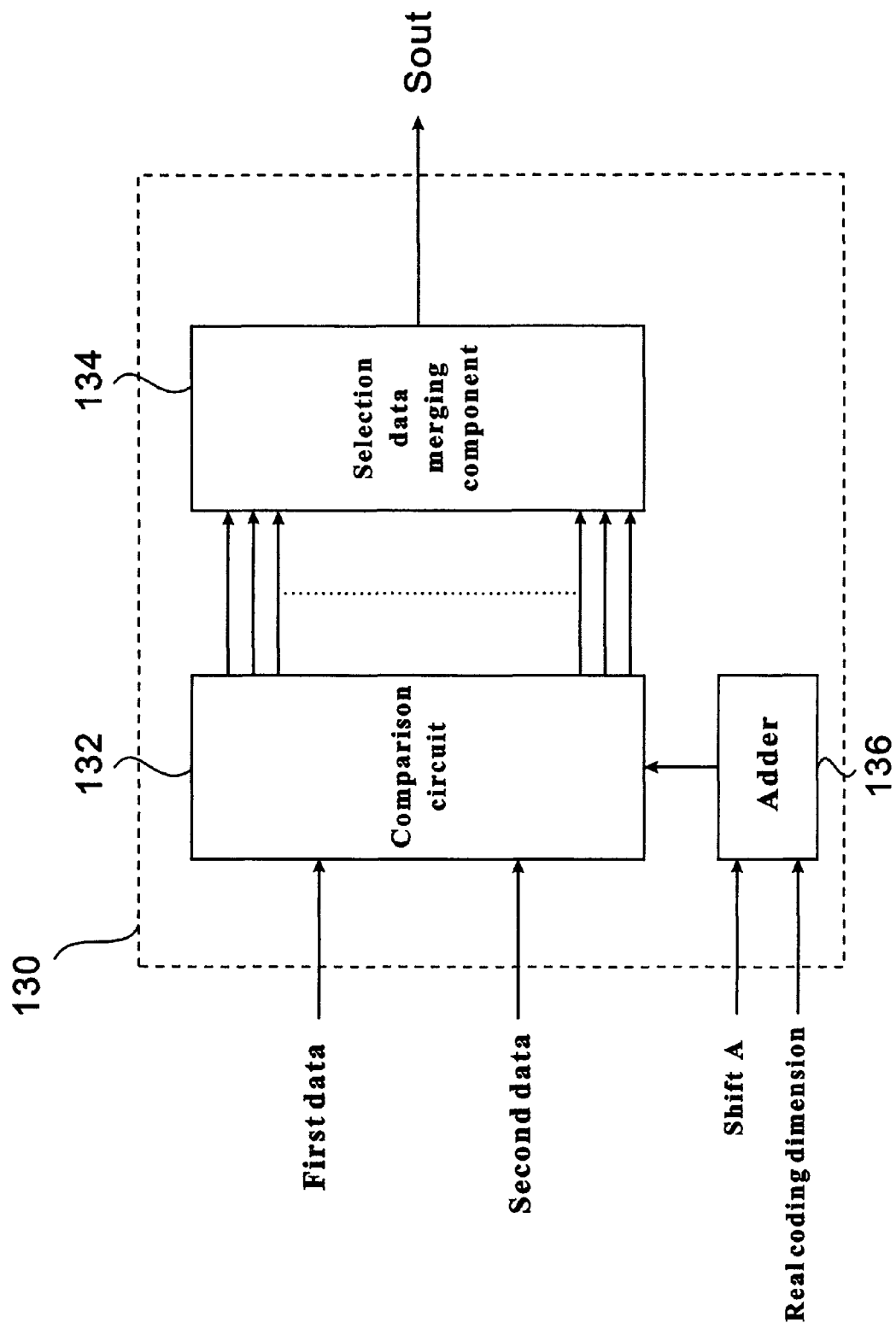

METHOD AND APPARATUS FOR SWITCHING DATA IN COMMUNICATION SYSTEM

FIELD OF THE INVENTION

The present invention relates to a data switching apparatus and method, it specifically relates to a method and apparatus for switching data in communication system.

BACKGROUND OF THE INVENTION

In a communication system, data switching apparatus is needed to convert a source data transmitted from the previous circuit into an output data to be used by subsequent circuit for data processing. Data switching apparatus is just like a translation system between previous circuit and the subsequent circuit, the previous circuit needs a data-switching apparatus to convert source data into output data that can be controlled by the subsequent circuit before data processing can be performed by the subsequent circuit. Therefore, it is indispensable no matter in the transmitter or the receiver of communication system. Here, the output data is generated by shifting the source data. Note that, the communication specification it supports has to be decided and needs to match the above-mentioned previous circuit processing and data transmission. For example, IEEE 802.16e Worldwide Interoperability for Microwave Access (WiMax), IEEE802.11n, Digital Video Broadcasting (DVB), $4^{th}$ generation mobile communication (4G) and Ultra-Wideband (UWB), etc. Therefore, all the source data received by data switching apparatus should match the coding dimension as specified by the communication specification.

In conventional data switching apparatus, since data shifting is needed to achieve the purpose of converting the source data transmitted from the previous circuit into output data; therefore, shifter circuit is needed to perform the operation of shifting data. Conventional shifter circuit is designed with data shifting data component, that is, multiple numbers of multiplexers are used to move the source data. Each multiplexer is connected to the data of two neighboring bit in source data and the last multiplexer is connected to the highest bit and the lowest bit of the source data; then through the by controlling the multiplexer, and complete the shifting operation of source data. However, the number of multiplexer is related to the coding dimension and each communication specification has multiple sizes of coding dimensions; moreover, all the coding dimension are different, take the WiMax) as an example, it has 19 sizes of coding dimensions for the LDPC (Low Density Parity Check) encoder and decoder, thus, the above-mentioned coding dimensions of source data are all different. Therefore, in conventional data switching apparatus, the shifter circuit design in dealing with fixed size of coding dimensions which the architecture includes one fixed size shifter circuit and perform only single coding dimension, that is, it is not allowed to use the same shifter circuit to shift source data according to multiple sizes of coding dimension.

Take WiMax as an example, if all the 19 sizes of coding dimensions specified by WiMax LDPC code are to be used in the communication production, data switching apparatus should be implemented using a circuit comprising of 19 different sizes shifters to process corresponding data for 19 sizes of coding dimensions respectively. The electronic circuit will occupy pretty large chip area and the complexity of hardware design will be relatively increased too. Furthermore, the manufacturing cost is relatively increased too.

Therefore, it is highly expected that a multi-size coding dimensions data switching apparatus for communication system that reduces circuit area and hardware complexity can be invented.

SUMMARY OF THE INVENTION

One purpose of the present invention is to provide a method and apparatus for switching data in communication system and can switch all sizes of the coding dimensions defined in of the communication specification.

Another purpose of the present invention is to provide a method and apparatus for switching data in communication system in order to simplify the circuit and reduce the hardware cost.

Yet another purpose of the present invention is to provide a method and apparatus for switching data in communication system that reduces the chip area and the complexity of hardware.

According to the above-mentioned purposes of the present invention, a method and apparatus for switching data in communication system is proposed, which uses a conversion circuit to receives a source data possessing in the real or expected coding dimension, then the source data is converted to a converted data possessing in a tolerable or maximum coding dimension; judgment bits are inserted in the converted data to designate the data as source data or not. Later on, only one shifter circuit is used to shift the converted data in certain shift amount so as to generate a shifted data; meanwhile, the right side and the left side of shifted data are used to acquire the real coding dimension to be used as the first data and the second data respectively. Finally, a comparison and selection circuit is used to compare the corresponding judgment bits in the first and the second data and select the final output data.

According to the above-mentioned purposes of the present invention, a method and apparatus for switching data in communication system is proposed. First, the source data possessing in the real or expected coding dimension is received; then the source data is converted into converted data possessing in a tolerable or maximum coding dimension, wherein the real coding dimension should not be larger than the tolerable coding dimension. Moreover, by setting or inserting the judgment bits, the source data is designated as the correct bit and the non-source data is designated as the error bit. The converted data are shifted according to a certain shift amount to generate a shifted data. The lower part and higher part of shifted data in the real coding dimension are used to be used as a first data and a second data respectively. Finally, the output data is selected by comparing the corresponding judgment bits in the first and the second data.

According to the above mentioned purposes of the present invention, we propose another data switching apparatus used in communication system, which mainly consists of a conversion circuit to receive a source data having real coding dimension and to convert the source data into converted data having tolerable coding dimension; meanwhile, judgment bit is installed in the converted data so as to designate whether the converted data is the source data or not. Later on, a shifter circuit performs a shift on the converted data so as to generate a shifted data, meanwhile, the highest bit of the shifted data starts to acquire a second data and the highest bit of the shifted data is deducted with the bit of the real coding dimension to be used as the starting bit of a first data; furthermore, starting from the starting bit, real coding dimension is acquired in the lowest bit direction of the shifted data so as to be used as a first data; however, if the lowest bit from the starting bit to the shifted data is smaller than the real coding dimension, the acquisition will be continued from the highest bit of the shifted data so that the first data is equal to the real coding dimension. Finally, a comparison and selection circuit is used to compare the corresponding judgment bits in the first data and the second data so as to selectively send out this source data.

According to the above mentioned purposes of the present invention, we also propose another data switching method used in communication system. First, source data having real coding dimension is received and the source data is converted into a converted data having tolerable coding dimension; furthermore, the real coding dimension should not be larger than the tolerable coding dimension; and through the installation of judgment bit, the source data site is designated as correct bit and the non-source data site is designated as error bit; moreover, shift the converted data a certain shift amount so as to generate a shifted data; then respectively the highest bit of the shifted data is deducted with the bit of the real coding dimension and the real coding dimension is acquired from the highest bit of the shifted data toward the lowest bit direction of the shifted data so as to be used a first data and a second data; finally, the corresponding judgment bits in the first data and the second data are compared so as to selectively send out the source data.

BRIEF DESCRIPTIONS OF THE DRAWINGS

Figure 4A:
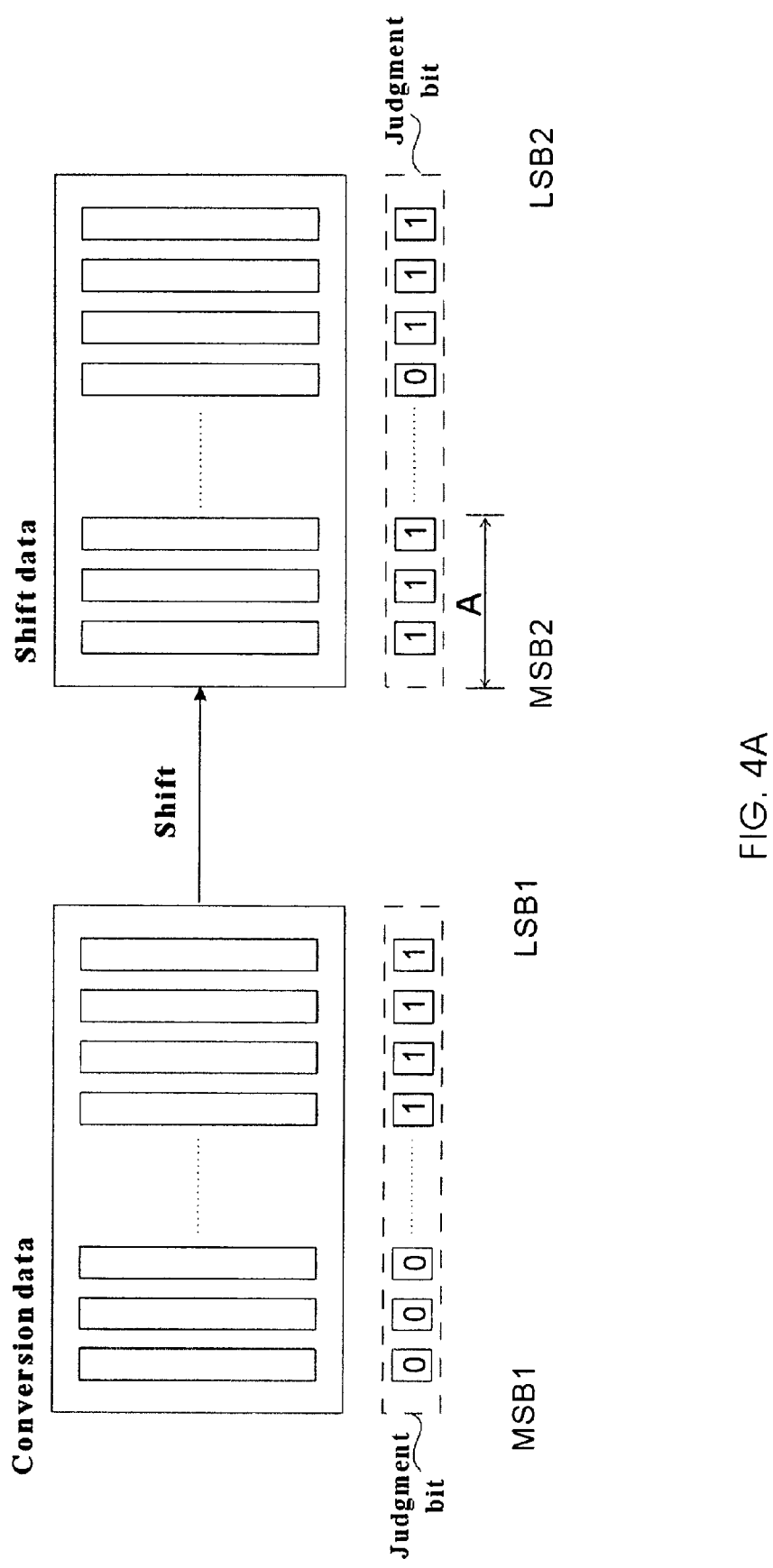
Figure 4B:
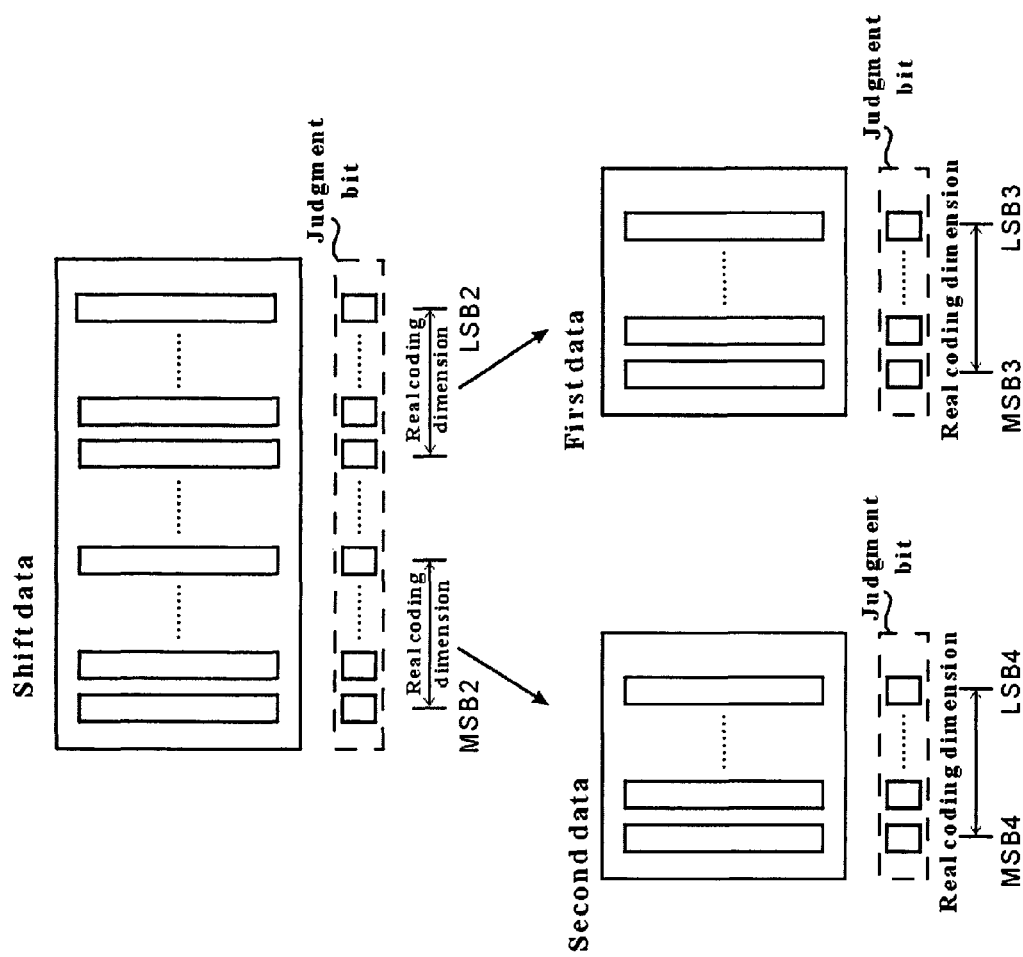
Figure 6:
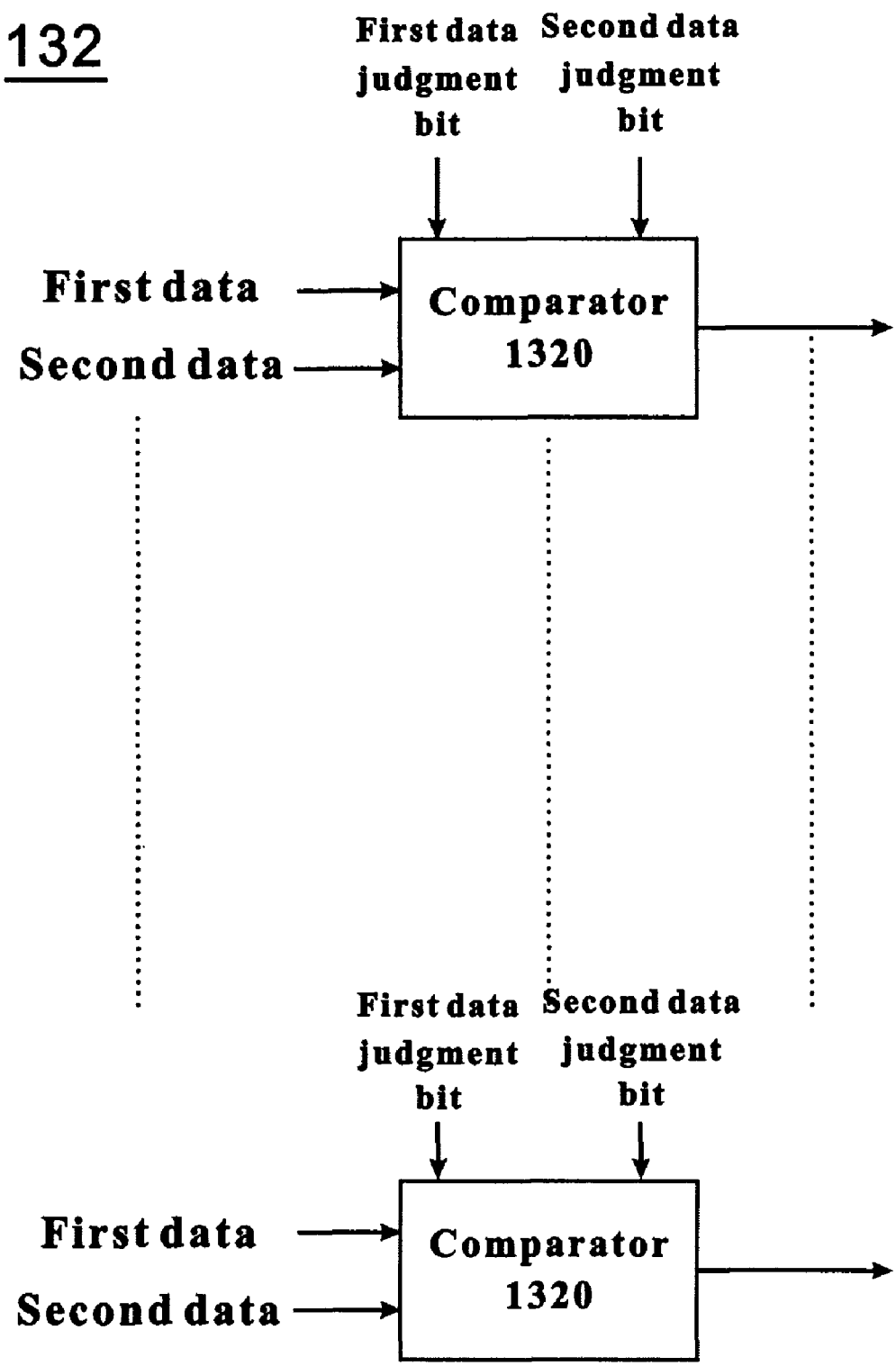
Figure 7:
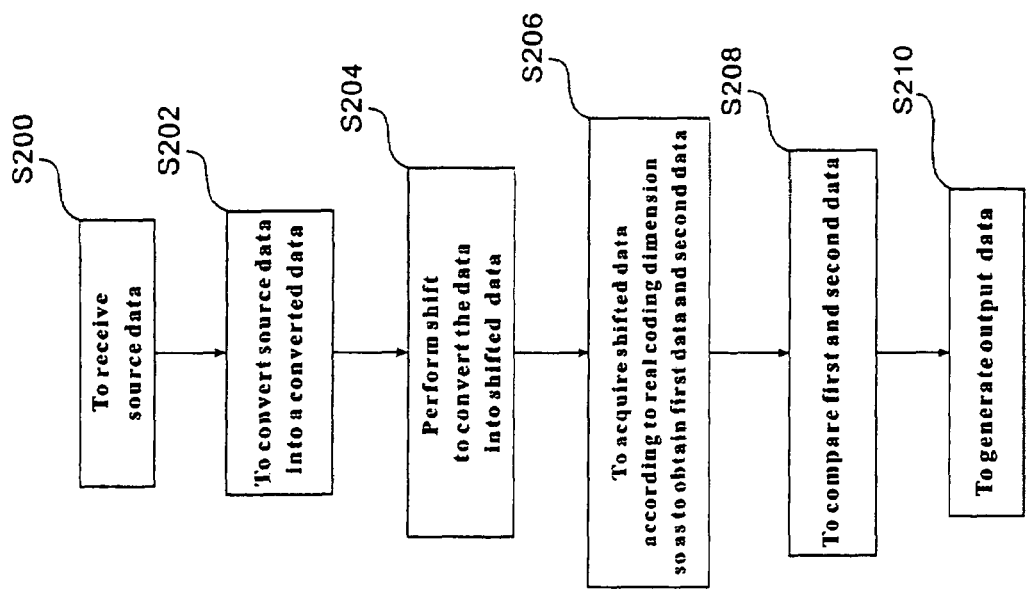

FIG. 4A~4B is the illustration of processing flows of shifter circuit of the present invention;

FIG. 5 is the basic architecture of comparison and selection circuit of the present invention;

FIG. 6 is the basic architecture of comparison circuit of the present invention;

FIG. 7 is the process flow of data switching of the present invention; and

Figure 8:
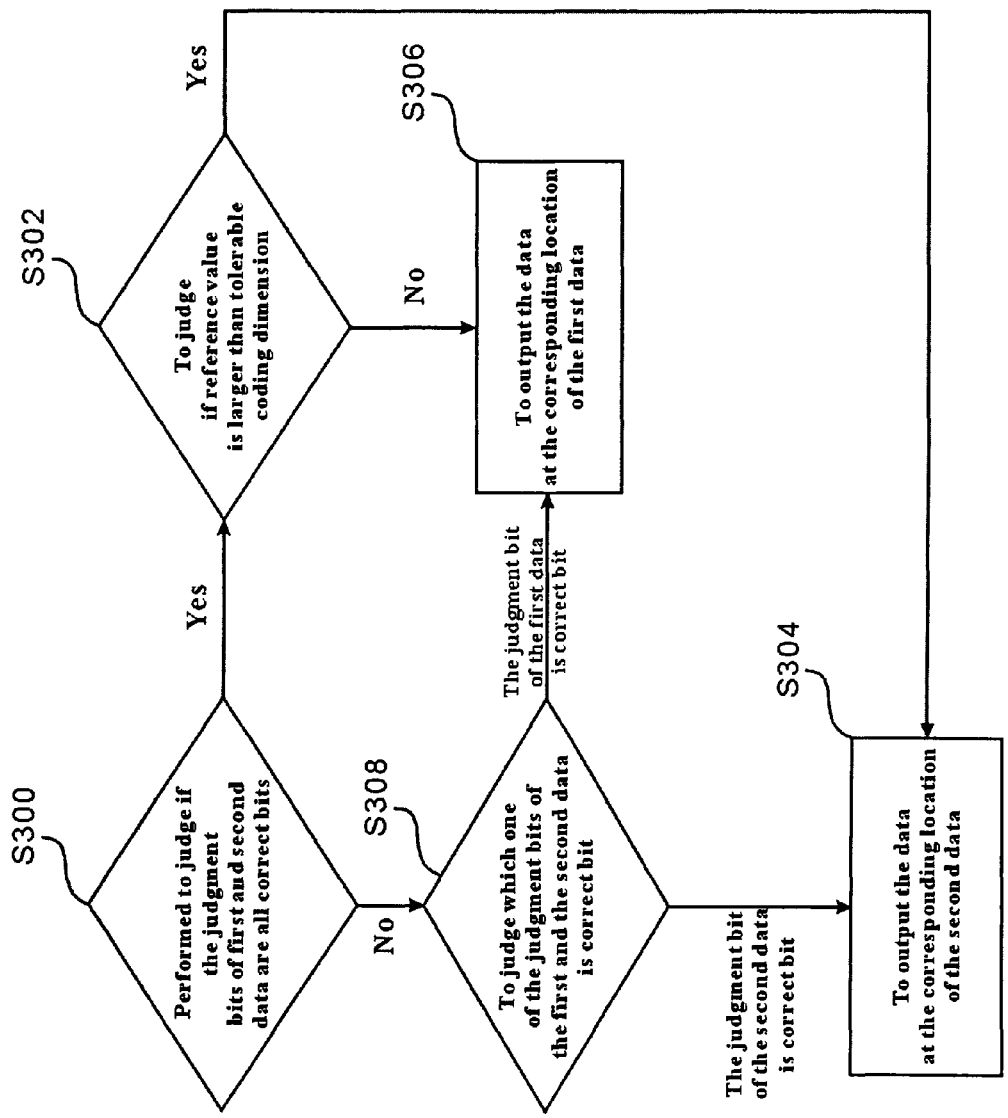
Figure 9:
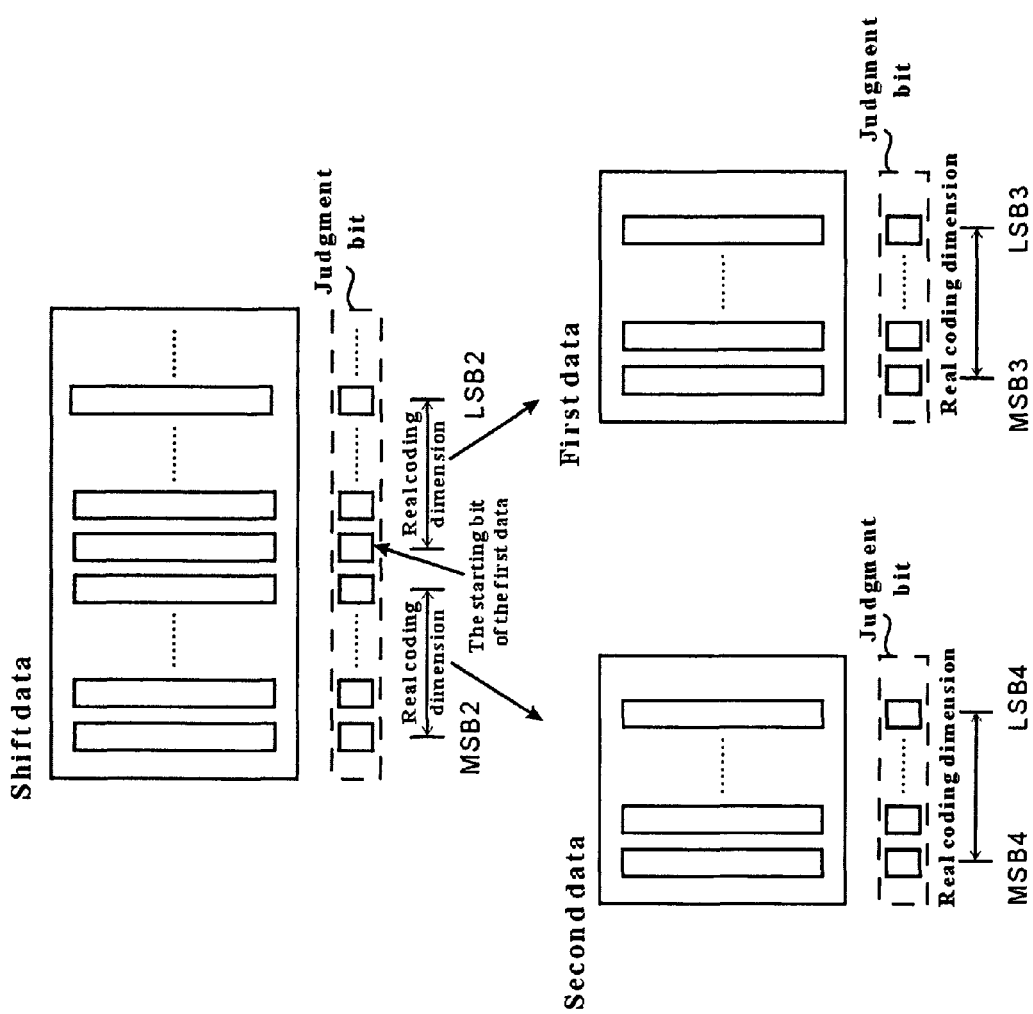
Figure 10:
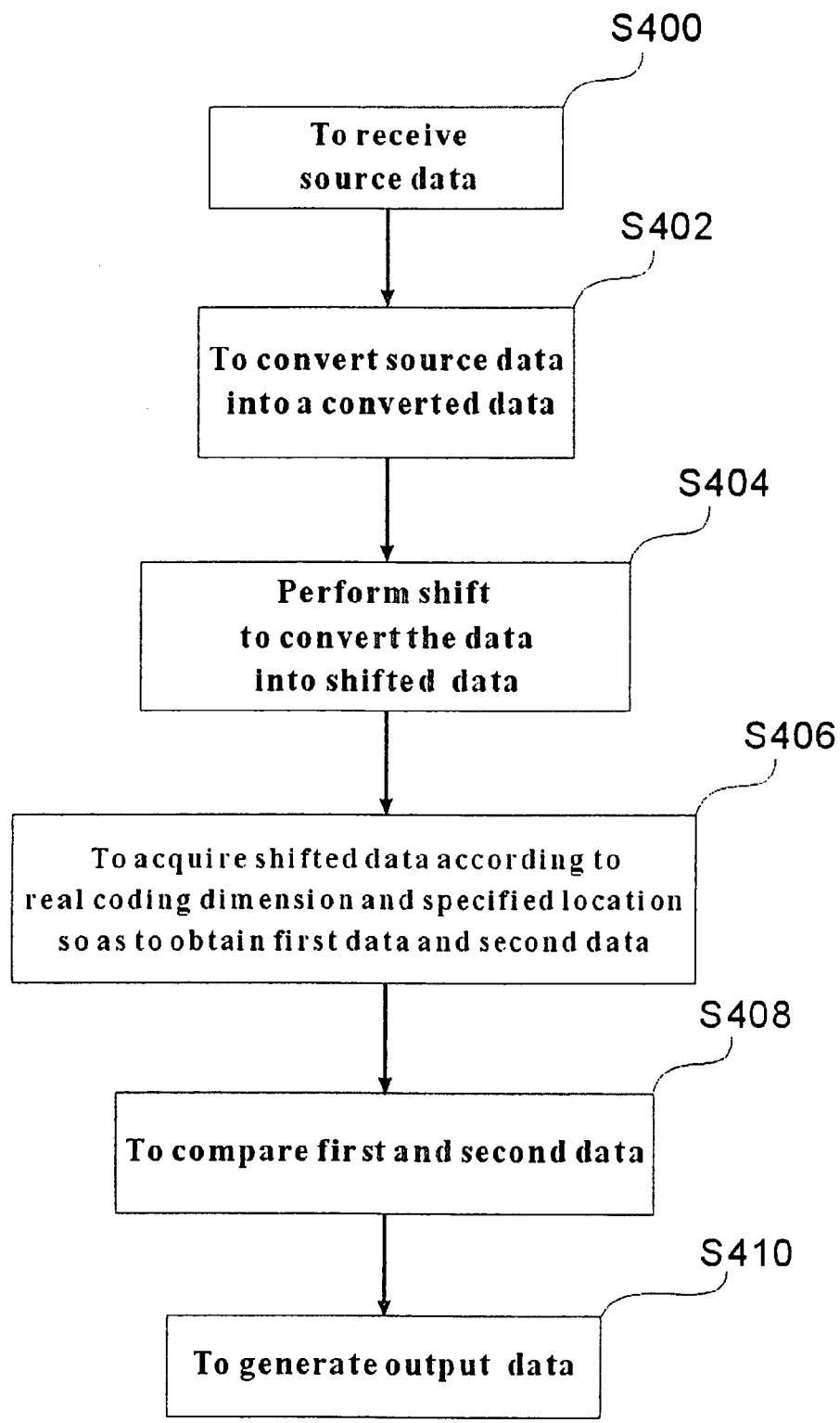

FIG. 8 is the process flows of a method of comparison of the judgment bits of the first and the second data of the present invention;

FIG. 9 is an illustration of a second processing flow chart of the shifter circuit of the present invention; and FIG. 10 illustrates a second data switching method and process flow chart of the present invention.

DETAILED DESCRIPTION OF THE PREFERRED EMBODIMENTS

A method and apparatus for switching data in communication system is provided in the present invention. What makes it different than conventional data switching apparatus is, for the data switching apparatus of the present invention, under the communication specification supported by the communication system, the source data can be shifted according to all sizes of coding dimensions by such a data switching apparatus; therefore the limitation issues of corresponding treatment in conventional data shifter is that shifts the source data according to one fixed coding dimension only. Note that, data switching apparatus of the present invention uses only one size shifter circuit; therefore, the space and chip area used to implement the electronic circuit design is correspondingly much smaller than the conventional data switching apparatus or a multi-size shifter in the multi-sizes of coding dimension, and of course, the complexity of electronic circuit design is relatively lower.

Figure 1:
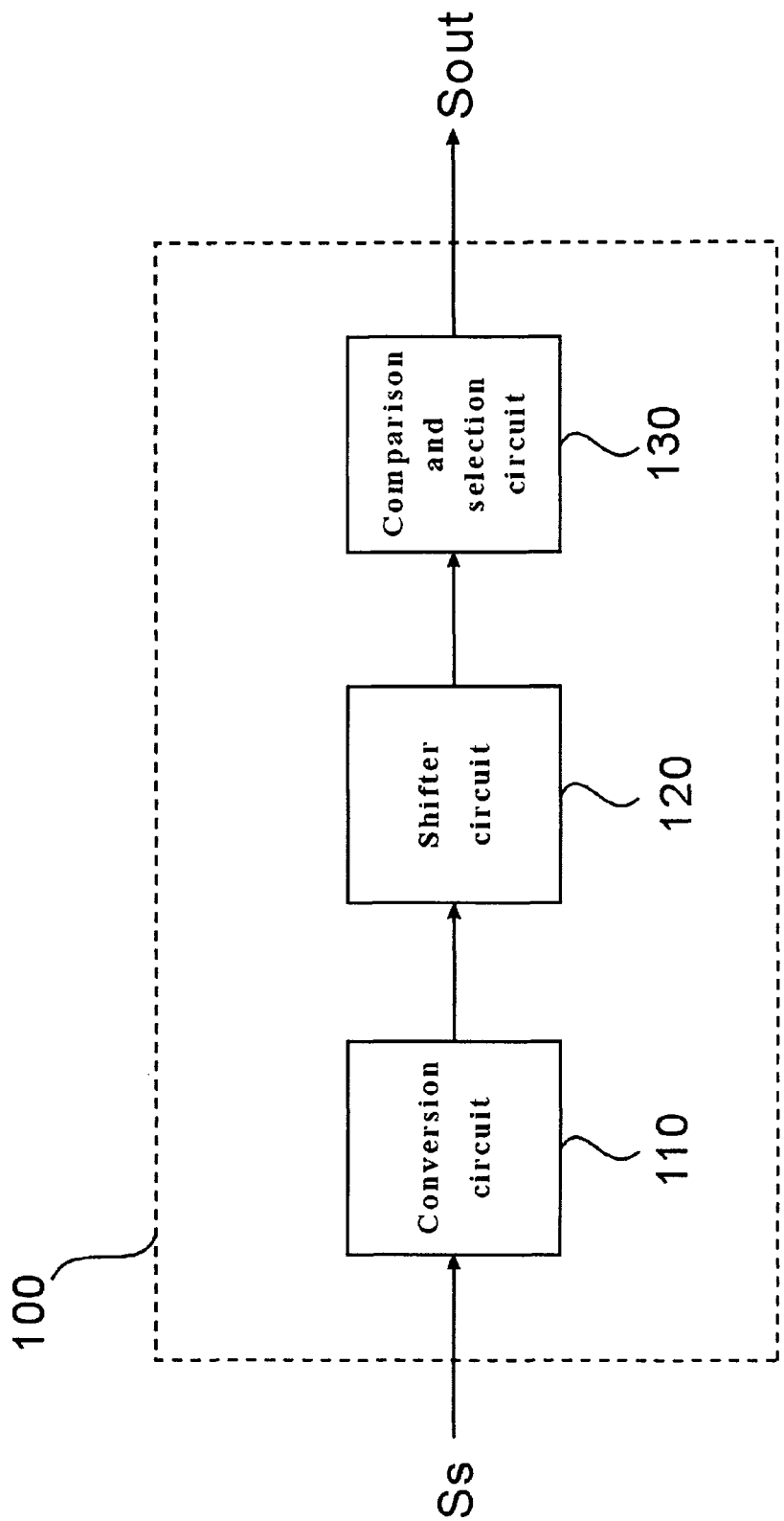
FIG. 1 shows the data switching apparatus of the present invention.

FIG. 1 shows the data switching apparatus of the present invention, data switching apparatus 100 comprising of a conversion circuit 110, a shifter circuit 120 and a comparison and selection circuit 130. The data switching apparatus 100 is mainly used to receive a source data Ss and to perform shift the source data Ss according to the certain shift amount in order to generate an output data Sout that the output data Sout is the data which is shifted by a certain shift amount of the source data Ss. Here, the shift operation of source data Ss can be achieved according to all sizes of coding dimensions defined in the communication specification. We use the real coding dimension to represent the expected coding dimension. Conversion circuit 110 is to receive the source data Ss and to convert it into a data possessing in the tolerable coding dimension with feature of fixed coding dimension, meanwhile, judgment bits are inserted during the conversion process so that what is source data Ss and what is non-source data inserted in the conversion process can be distinguished in the converted data. Shifter circuit 120 performs certain shift amount of shift on the received converted data so that to generate a shifted data, then, the right side and left side of shifted data are used to acquire the real coding dimension to be used respectively as a first data and a second data. Finally, comparison and selection circuit 130 is used to compare the judgment bits in the first data and the second data so as to obtain output data Sout. In the followings, we are going to introduce further the basic architecture of a conversion circuit 110, a shifter circuit 120 and a comparison and selection circuit 130.

Figure 2:
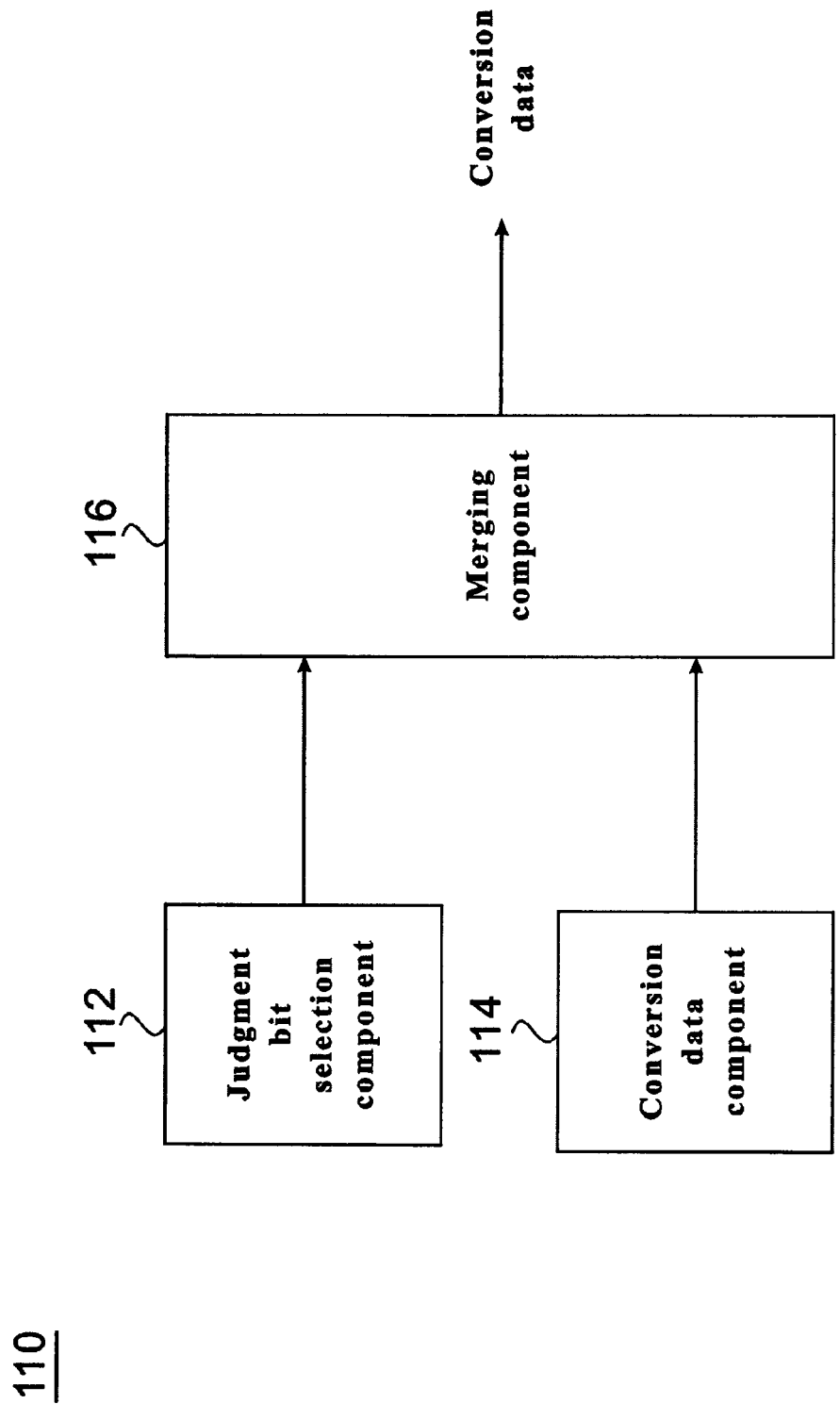
FIG. 2 shows the basic architecture of conversion circuit of the present invention.

FIG. 2 shows the basic architecture of conversion circuit of the present invention. Conversion circuit 110 comprising of a judgment bit selection component 112, a data conversion component 114 and a merging component 116. The function of judgment bit selection component 112 is to provide judgment bits and the function of data conversion component 114 are that let the subsequent output converted data to possess the tolerable coding dimension through the adding of a differential quantity of non-source data which is equal to the difference between the tolerable coding dimension and the real coding dimension; the judgment bits should be designated according to the source data Ss and the non-source data. The functions of judgment bits selection component 112 and data conversion component 114 can be achieved through multiplexer or other circuit of the same function. Finally, the source data Ss and the non-source data are selected using the judgment bits and the data conversion component 114 is merged through merging component 116 and a converted data is then sent out. What needs to be noticed is, the real coding dimension must be not larger than the tolerable coding dimension, in other words, the maximum value of real coding dimension that can be used by source data Ss is the tolerable coding dimension.

Take the communication specification in WiMax as an example, it has 19 sizes of coding dimensions as: 24, 28, 32 . . . 96. Tolerable coding dimension can be set up as the largest value 96 of the 19 sizes of coding dimension and the real coding dimension can then be selected as the 19 sizes of coding dimensions in WiMax. If the real coding dimension is 24, the judgment bit selection component 112 will then provide 24 the correct bits and 72 the error bits; moreover, in addition to source data Ss, data conversion component 114 has to provide 72 sets of non-source data; furthermore, the correct bit has to be added correspondingly on the part of source data Ss through the merging component 116 and the error bit has to be added correspondingly on the part of non-source data through the merging component 116, that is, the converted data is generated. Judgment bits selection component 112 provides in the judgment bits in the input endpoint corresponding to 19 sizes of coding dimension, for example, 24 the correct bits and 72 the error bits, 28 the correct bits and 68 the error bits, etc.; moreover, the judgment bits at the input end point are selected through the real coding dimension. Similarly, the data conversion component 114 provides in the non-source data in the input endpoint corresponded to 19 sizes of coding dimensions, and then non-source data at the input end point is selected through the real coding dimension, then source data of the real coding dimension is added to the output data in the size of the tolerable coding dimension. What needs to be noticed here is, the selection range of real coding dimension should be decided by the tolerable coding dimension; if the tolerable coding dimension is set as 32, then real coding dimension can only be selected as 24, 28 and 32.

Figure 3:
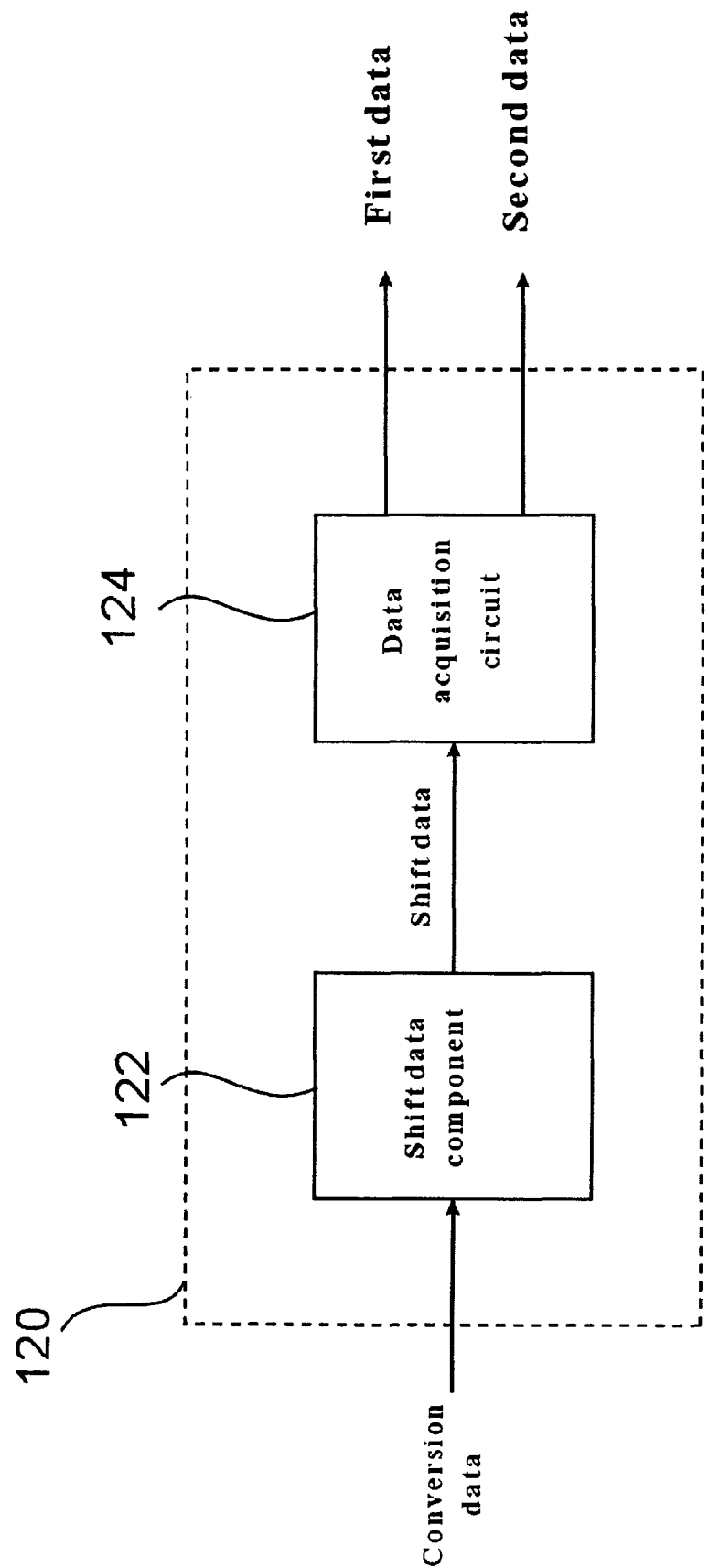
FIG. 3 is the basic architecture of shifter circuit of the present invention.
Figure 3A:
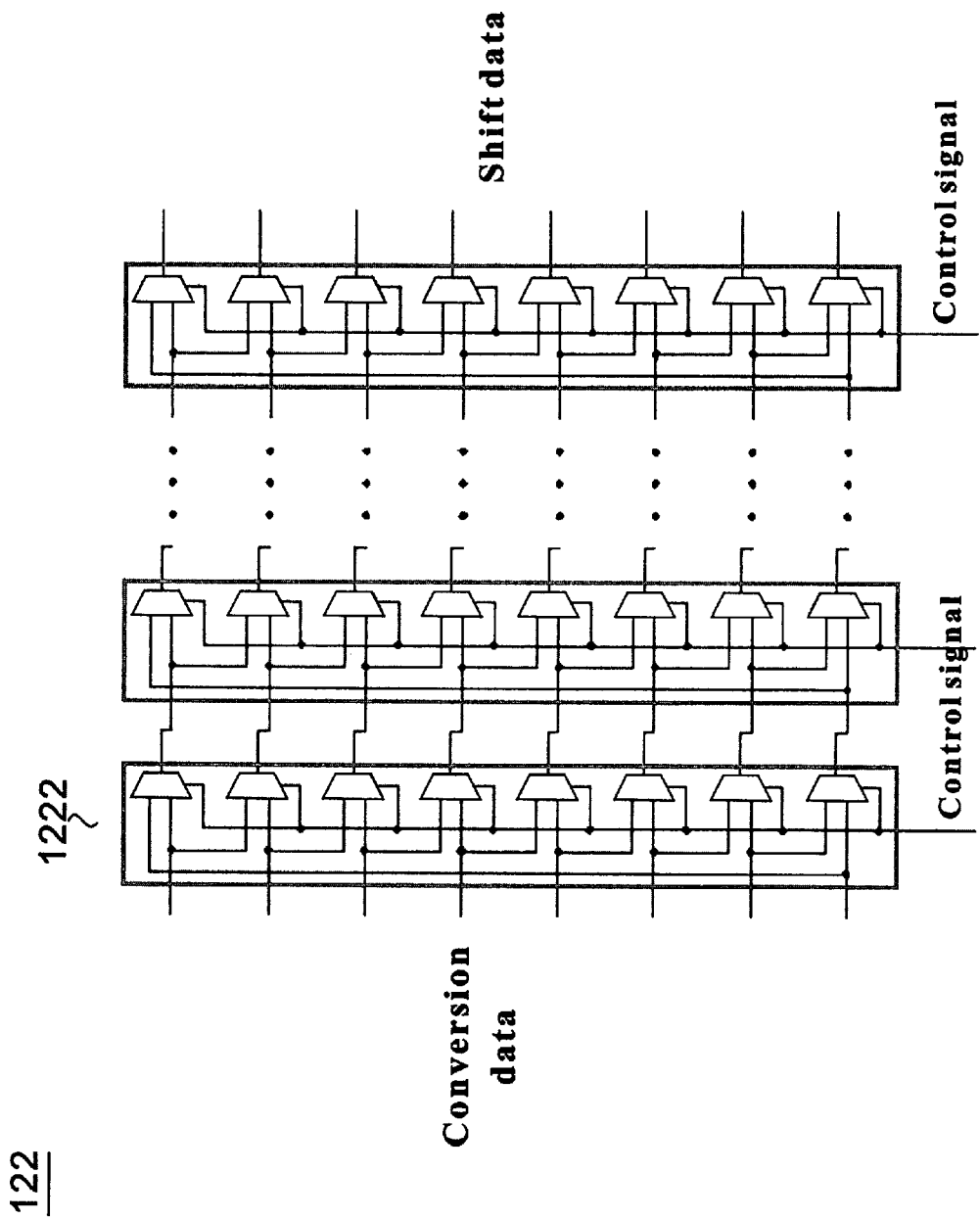
FIG. 3A is the basic architecture of the shifter component of the present invention.

FIG. 3 shows the basic architecture of shifter circuit of the present invention. FIG. 3A shows the basic architecture of the shift data component of the present invention. FIG. 4A~4B are the illustrations of the processing flows of shifter circuit of the present invention. Please refer to FIG. 3 and FIG. 4A~4B at the same time to make the explanation easier. Shifter circuit 120 comprising of a shift data component 122 and a data acquisition circuit 124. After the converted data is received by the shift data component 122, a shift action is performed on the converted data so that the converted data is shifted a certain shift amount to become shifted data as shown in FIG. 4A. Here, the parts of judgment bits are reserved in the converted data and the shifted data and we designate the correct bit as 1 and error bit as 0; however, according to different design, the correct bit can also be designated as 0 and the error bit can be designated as 1. In the process of converted data, we define the right side part of conversion data is LSB1 and the left side part of conversion data is MSB1; for the execution of shift action, it is started from the right side part LSB1 to the right by a shift amount of A to become shifted data. Of course, according to different design, the execution of the shift action can also be changed to a start from right side part LSB1 to the left in certain shift amount.

Please refer to FIG. 3A, which shows that the design of shift data component 122 is to use the first grade circuit 1222 to receive converted data, then circuit in each grade is connected to the data generated in the previous grade so as to convert the converted data into shifted data. Take the first grade circuit 1222 as an example, multiple numbers of multiplexers are used to move the source data and each multiplexer is connected to the data of two neighboring bits of the converted data, and the last multiplexer is connected to the highest bit and the lowest bit of the converted data; then control signal is used to select the output data in each multiplexer, and the principle of each grade of circuit is the same as the first grade circuit 1222; then through the design of each grade of electronic circuit, the shift amount can be controlled, generally speaking, the electronic circuit grade of shift data component 122 is equal to the tolerable coding dimension minus 1. Wherein the number of multiplexer in each grade of electronic circuit should be equal to the tolerable coding dimension, Take FIG. 3A as an example, the tolerable coding dimension is 8, the number of multiplexer of the first grade circuit 1222 thus must be equal to 8 and shift data component 122 then has 7 grades of electronic circuit. What needs to be noticed here is, the design of shift data component 122 it the same as the design of the conventional shift data component; the difference is, the design of shift data component 122 is corresponded to the tolerable coding dimension, there is no need to design circuit that is not corresponded to the tolerable coding dimension; the main reason is, the design of conversion circuit 110 of FIG. 1 makes the coding dimension of the shifted data fixed, therefore, the design of shifted data component 122 only needs to be corresponded to the coding dimension of the shifted data.

Please further refer to FIG. 3 and FIG. 4A~4B. Data acquisition circuit 124 is to acquire part of the shifted data so as to output the first data and the second data as shown in FIG. 4B; the real coding dimension is acquired to start at the right side part of shift data LSB2, this is the so-called the first data, and then real coding dimension is acquired to start at the left side part of the shift data MSB2, this is the so-called the second data.

FIG. 5 shows the basic architecture of comparison and selection circuit of the present invention. Comparison and selection circuit 130 comprising of comparison circuit 132 and selection data merging component 134. Comparison circuit 132 receives the first and the second data and selected output data that is designated as correct bits through a comparison of judgment bits at corresponding locations of the first and the second data. Here, please refer to FIG. 4B, since the first and the second data are data of the real coding dimension length at the same time, comparison circuit 132 is thus judgment bit which compares the same location of the first and the second data; for example, the judgment bits are compared and start from the right side part of the first data LSB3 of the and the right side part of the second data LSB4 of the second data, and the comparison is done one by one until the judgment bits of the left side part of the first data MSB3 and the left side part of the second data MSB4; when the judgment bit of the comparison is designated as correct bit, comparison circuit 132 will select the output data with the correct bits, that is, selection data. What needs to be noticed is, there is no limitation on the starting order of comparison in comparison circuit 132, in addition to start the comparison from the right side part of the first data LSB3 and the right side part of the second data LSB4, the judgment bit comparison can also be started from the left side part of the first data MSB3 and the left side part of the second data MSB4.

Selection data merging component 134 is to receive selection data sent out from comparison circuit 132 and merge the data into output data Sout, that is, source data Ss of A the shift amount.

FIG. 6 is the basic architecture of comparison circuit of the present invention. Comparison circuit 132 needs to possess comparator 1320 with a quantity the same as the tolerable coding dimensions, this is as shown in FIG. 6, each comparator 1320 will compare the judgment bits at the corresponding location of the first data and the second data and output selected data which is designated as the correct bit. Wherein, each comparator 1320 operates independently and will not affects the others. Therefore, through the simultaneous action of each comparator 1320, the parallel processing effect can then be reached and the processing time of data switch can then be shortened in data switching apparatus of the present invention can be applied in communication system of high performance and high speed.

What needs to be noticed is, the length of the first and the second data is the same as the length of real coding dimension; during the comparison of the judgment bits and the output of selected data, comparator 1320 only of the quantity of real coding dimension will be used, therefore, only under the situation when the real coding dimension is equal to the tolerable coding dimension, all the comparison circuits 132 will be used.

Please refer again to FIG. 5, the comparison and selection circuit 130 further comprising of an adder 136. When comparator 1320 compares the judgment bits at the corresponding location of the first and the second data, it is not true in each time that only one is the correct bit and another one is the error bit; therefore, adder 136 needs to be used for the adding of shift amount A and the quantity of the real coding dimension in order to generate a reference value to be used as reference standard. When the judgment bits of the first data and the second data in comparator 1320 are all correct bits and if reference value is larger than tolerable coding dimension, output the second data, otherwise, output the first data.

What needs to be noticed is, as shown in FIG. 1, when shifter circuit 120 performs shift action of data conversion, if the shift amount is not too large, it is easier for the comparison and selection circuit 130 to all appear correct bits when the judgment bits of the first and the second data are compared; although as mentioned before, when the reference value is larger than the tolerable coding dimension, the output will be second data and on the contrary, the output will be the first data, yet there are still some corner case conditions that are difficult to judge. That is, when the range of real coding dimension is larger than ⅔ of the tolerable coding dimension but smaller than the tolerable coding dimension and when all the judgment bits of the first data and the second data are all correct bits, that is, as mentioned above, the situation that the comparison of judgment bits of the first and the second data does not fully apply. Take the tolerable coding dimension of 96 as an example, if the real coding dimension is 92 and the shift is 50, the comparison of judgment bits of the first and the second data as mentioned above does not apply here, as shown in FIG. 5, comparator 1320 must output the part of the first data. For those parts that are not applicable to the judgment method as mentioned above, they can be solved by limitation method or the adding of an additional database for judgment. Wherein, the so-called limitation method means when the judgment method as mentioned above is not fully applicable, we must limit the sum of the real coding dimension and the shift amount to be smaller than the tolerable coding dimension. The judgment method of adding additional database means to measure in the advance real coding dimension and shift amount in order to acquire data that is not applicable to the method of comparison of the judgment bits of the first and the second data as mentioned above and place this data in the additionally added database; therefore, when the situation that the judgment method is not fully applicable happens, it can be judged through a comparison of the data added in the database. The additionally added database can be memory device, for example, flash memory, hard disk, non-volatile memory, etc.

FIG. 7 is the data switching method process flow of the present invention, which is used to further explain the operation process flow of data switching apparatus. First, step S200 is to receive source data Ss, and the same as what is mentioned above, source data Ss possesses the length of real coding dimension, then enter step S202 to convert source data Ss into a converted data possesses according to the size of the tolerable coding dimension and judgment bits. Wherein, the real coding dimension is not larger than the tolerable coding dimension. Through the insertion of judgment bits in the converted data, the source data Ss location in the converted data is designated as correct bits, and the non-source data location provided by data conversion component 114 as mentioned above is designated as error bits; therefore, in the subsequent data switch action, we can recover source data Ss according to correct bits.

Later on, step S204 will perform shift to convert the source data into shifted data. The main purpose of this step is to let source data Ss make a shift and to get output data that is source data Ss shifted according to a certain shift amount after the data switching.

In the next step, S206, is to acquire shifted data according to the real coding dimension so as to obtain the first data and the second data, that is, as mentioned above, starting to acquire data of the length of real coding dimension from the right side of the shift data LSB2 and the left side of the shift data MSB2, that is, the first and the second data.

Next, perform step S208 to compare the first and the second data. As mentioned above, the first and the second data are data in sizing of the real coding dimension, therefore, the comparison of the first and the second data as mentioned in step S208 means to perform comparison of judgment bits at the corresponding location of the first and the second data; for example, at the lowest bit location of the first and the second data, both judgment bits are compared in order to output data at a location designated as correct bits, that is, the selection data as mentioned above. Finally, step S210 is perform to generate output data, that is, to merge all the selection data in order to generate output data Sout as mentioned above. Wherein, in the first and the second data, the comparison method of each judgment bit in each corresponding location is the same, the comparison of judgment bits at the lowest bit and the highest bit location is the same and the comparison of judgment bit will be described as follows.

FIG. 8 is the processing flow of a method of comparison of the judgment bits of the first and the second data, that is, the processing flow of comparison of the first and the second data of step S208 as mentioned in FIG. 7. First, S300 is performed to judge the condition which if the judgment bits of the first and the second data are all correct bits, if so, the judgment principle must be executed, that is, step S302 has to be executed to judge the condition which if reference value is larger than tolerable coding dimension.

If so, execute S304 to output the data at the corresponding location of the second data; if no, execute step S306 to output the data at the corresponding location of the first data. For example, please refer to FIG. 4B, when the judgment bits of the left side of the first data MSB3 and the left side of the second data MSB4 are all correct bits and if the reference value is larger than tolerable coding dimension, then the data at the left side of the second data MSB4 must be used as selection data. Similarly, when the reference value is smaller than the tolerable coding dimension, the data at the left side of the first data MSB3 of the first data must be used as selection data.

Then go back to step S300, if the judgment bits of the first data and the second data are judged not to be all correct bits, go to step S308 to judge which one of the judgment bits of the first and the second data is correct bit, if the judgment bit of the first data is correct bit, execute step S306; if the judgment bit of the second data is correct bit, execute step S308. Of course, in step S308, the way of judging the judgment bits of the first and the second data to decide which one is correct bit can be changed to the judgment of the first data to see if it is correct bit or to the judgment of the second data to see if it is correct bit. Through the method of a comparison of judgment bits of the first and the second data as shown in FIG. 8, we can further know that the purpose of insertion judgment bits in the step S202 in FIG. 7 is for comparison.

However, in the first and the second data, when the range of real coding dimension is larger than ⅔ of the tolerable coding dimension and smaller than the tolerable coding dimension and when the judgment bits of the first data and the second data are all correct bits, the method of comparison of judgment bits of the first and the second data as in FIG. 8 is not fully applicable; therefore, other judgment steps and the corresponding treatments are needed to be added so that it will be no mistakes in the method of comparison of judgment bits of the first and the second data as in FIG. 8.

Therefore, between step S202 and step S204 as in FIG. 7, it further comprises of a step of judging the range of real coding dimension to see if the range of real coding dimension is larger than ⅔ of the tolerable coding dimension and smaller than the tolerable coding dimension, if so, the sum of real coding dimension and the shift amount must be limited to be smaller than the tolerable coding dimension, that is, the reference value must be smaller than the tolerable coding dimension; however, since the real coding dimension of source data Ss received in step S200 in FIG. 7 is fixed, the reference value thus must be smaller than the tolerable coding dimension, which is a limitation of shifter; if no, go to step S204. The situation of difficult judgment as in step S208 will thus not happen through the execution of this step. In addition to such method, the other judgment step and the corresponding treatment will be described as in the followings.

Between step S302 and step S204 as in FIG. 8, it further comprises of a step of judging the range of real coding dimension to see if the range of real coding dimension is larger than ⅔ of the tolerable coding dimension and smaller than the tolerable coding dimension; if so, it must be dealt with the adding of additional database for judgment, that is, to compare to see if the real coding dimension and the shift match the data in the additionally added in the database, if so, execute step S306, if not, execute step S308. Wherein, the content of the database is acquired from the non-applicable data that is a result of a comparison of the judgment bits of the first and the second data and through a shifter testing according to all size of real coding dimensions.

Here, a data switching apparatus and method for communication system of a second embodiment is proposed in the present invention, the structures in FIG. 1 and FIG. 2 are all not changed and they are described in the previous statement and will not be mentioned here again. In FIG. 3, the processing method of data acquisition circuit 124, in addition to the processing flow as mentioned previously, can also be replaced with other methods. FIG. 9 is a second process flow illustration of the shifter circuit of the present invention. Please refer simultaneously the processing flow of shifter circuit of FIG. 3, FIG. 4A and FIG. 9, that is, after a shift action is performed and completed on converted data by a shift data component 122 so as to convert the converted data into shifted data, the first data and the second data are then sent out. In other words, after the completion of the implementation of FIG. 4A, the process flow of FIG. 9 is then processed.

As shown in FIG. 9, real coding dimension is acquired starting from the highest bit MSB2 of the shifted data toward the lowest bit LSB2 of the shifted data to get a second data; moreover, real coding dimension bit is deducted from the highest bit MSB2 of the shifted data and real coding dimension is acquired toward the lowest bit LSB2 direction of shifted data to get the first data. Here, the result of the deduction of real coding dimension bit from the highest bit MSB2 of the shifted data can be called the starting bit of the first data.

Please refer to FIG. 3, during the acquisition of a first data by a data acquisition circuit 124, a starting bit of the first data should be obtained first and it can be achieved through hardware circuit or other methods; here the hardware circuit can be a multiplexer (not shown in the figure) to receive the highest bit and real coding dimension of the shifted data so as to obtain the starting bit of the first data.

Please refer simultaneously to FIG. 4B and FIG. 9, we can see that the greatest difference in the processing flow of these two shifter circuits is that the method used in FIG. 4B to output the first data is to acquire real coding dimension starting from the lowest bit LSB2 of shifted data toward the highest bit MSB2 direction of shifted data; but in FIG. 9, the real coding dimension is acquired starting from the starting bit of the first data toward the lowest bit LSB2 direction of shifted data. What needs to be noticed is since in the processing flow of FIG. 9, the acquisition of first data starts from the starting bit of the first data, but the length of the first data is decided according to real coding dimension; therefore, the length between the starting bit of the first data and the lowest bit LSB2 of the shifted data could be smaller than the real coding dimension; at this moment, the acquisition should be started from the highest bit MSB2 of the shifted data until the length of the first data is equal to the real coding dimension.

After the completion of the processing flow of FIG. 9 by the shifter circuit, the judgment bits of the first data and the second data are compared by the comparison and selection circuit 130 of FIG. 5 as described in the previous statement so as to select selected data that is designated as correct bit; then selection data merging component 134 is used to receive the selected data sent out from a comparison circuit 132 and merge it into output data Sout. Since both the first data and the second data are simultaneously the data of the length of real coding dimension, hence, comparison circuit 132 compares one by one the judgment bit at the same location of the first and the second data. What needs to be noticed is, the order of starting comparison for comparison circuit 132 is not limited, it can start from the lowest bit LSB3 and LSB4 but can also start from the highest bit MSB3 and MSB4.

Of course, since the comparison circuit 132 compares one by one the judgment bit in the first and the second data at the same location so as to selectively output selected data that is designated as correct bit; therefore, the same as FIG. 6, the comparison circuit 132 must possess comparator 1320 that is the same as the amount of tolerable coding dimension and each comparator 1320 must act independently.

What needs to be noticed is, when the comparator 1320 as in FIG. 6 is comparing the judgment bits at the corresponding locations of each of the first data and the second data and finding out that both the judgment bits at the corresponding locations of the first data and the second data are all correct bits, then the second data will be selected as selected data. However, such judgment method is applicable to the condition when all the judgment bits of the first data and the second data are correct bits; therefore, the adder 136 as in FIG. 5 does not need to be used, and of course, the limited shifted amount condition as in the first embodiment or the need to add other judgment steps are not necessary to select whether the first data or the second data as the selected data.

FIG. 10 is a process flow chart of a second data switching method of the present invention. Step S400 is to receive a source data Ss wherein the source data Ss possesses the length of real coding dimension. Later on, we enter step S402 to convert the source data Ss into a converted data wherein the converted data possesses the length of a tolerable coding dimension and judgment bit; what needs to be mentioned is the real coding dimension should not be larger than tolerable coding dimension. Through the installation of judgment bits in the converted data, the source data Ss location in the converted data will be designated as correct bit and the non-source data location will be designated as error bit so that in the subsequent data switching action the source data Ss can be recovered according to correct bit.

Later on in step S404, according to a shift amount, the converted data will be shifted to a shifted data; the main purpose of the step is to shift the source data Ss by a shift amount so that after the completion of data switching, the output data obtained will be source data Ss that has been shifted by a shift amount.

In the subsequent step S406, shifted data is acquired according to the real coding dimension and specified location so as to obtain a first data and a second data, that is, starting from the highest bit MSB2 of the shifted data toward the direction of the lowest bit MSB2 of the shifted data, data of the length of real coding dimension is acquired as the second data; meanwhile, starting from the difference between the highest bit MSB2 of the shifted data and the bit of real coding dimension toward the direction of the lowest bit MSB2 of the shifted data, data of the length of real coding dimension is acquired as the first data. Here, the result of the highest bit MSB2 of shifted data minus the bit of real coding dimension is the starting bit of the first data. What needs to be noticed is, the length of the first data should be equal to real coding dimension, if it is still insufficient, then an acquisition must be done starting from the highest bit MSB2 of the shifted data toward the direction of the lowest bit MSB2 of the shifted data.

Next, perform step S408 to compare the first and the second data. In the previous description, the first data and the second data are data that possess the length of real coding dimension; therefore, the comparison of the first and the second data as mentioned in step S408 is to compare the judgment bit at the corresponding location of the first and the second data. Finally, step S410 is performed to generate output data, that is, to combine all the selected data are combined to generate the output data Sout as mentioned previously. Here, in the first data and the second data, the comparison method of judgment bit at each corresponding location is the same, that is, the comparison method for judgment bit at the lowest bit location and the highest bit location is the same.

Step S408 shows a method to compare judgment bit in the first data and the second data. First, it needs to be judged whether the judgment bits of first data and second data are all correct bits, if so, selected data are sent out from the corresponding location of the second data; if not, that is, not the judgment bits of both the first data and the second data are all correct bits, then which of the judgment bit of the first data or the second data is correct bit should be judged; if the judgment bit of the first data is correct bit, then selected data is sent out from the corresponding location at the first data; if the judgment bit of the second data is correct bit, then selected data is sent out from the corresponding location at the second data. The purpose to add judgment bits at step S402 in FIG. 10 is to be used for comparison here.

We know from the above mentioned descriptions that only through the use of single data switch apparatus of the present invention, data switching action can be performed on the data of all kinds of coding dimensions under the communication specification, briefly speaking, in the present invention, only single shifter circuit design is needed to achieve the effect of conventional data switching apparatus which needs multiple electronic circuit designs to switch data according each different coding dimension individually. Therefore, the entire circuit design is simple and the layout of chip is very simple; moreover, the ship area of e circuit is much smaller than that of conventional data switching apparatus.

Although the present invention is disclosed with better embodiment as above, yet it is not used to limit the present invention; anyone who is familiar with this art can do any kinds of changes and modifications without deviating the spirit and scope of the present invention; therefore, the protection scope of the present invention should be based on what is claimed as follows.

What is claimed is:

1. An apparatus for switching data in communication system, comprising:
    a conversion circuit used to receive a source data having a real coding dimension so as to convert the source data into a converted data having a tolerable coding dimension, wherein there is a judgment bit on the converted data so as to designate the judgment bit of the source data as a correct bit and to designate the judgment bit of the non-source data as an error bit, and the real coding dimension is not larger than the tolerable coding dimension;
    a shifter circuit used to
        shift the converted data certain shift amount so as to generate a shifted data,
        starting from the most significant bit (MSB) of the shifted data toward the least significant bit (LSB) of the shifted data, acquire a real coding dimension as a second data, and subtract the most significant bit of the shifted data by the bit of the real coding dimension as the starting bit of a first data,
        starting from the starting bit toward the direction of the least significant bit of the shifted data, acquire a real coding dimension as the first data,
        wherein if from the starting bit to the least significant bit of the shifted data is smaller than the real coding dimension, the acquisition will be continued from the most significant bit of the shifted data; and
    a comparison and selection circuit, through a comparison of the judgment bit in the first data and the second data, used to send out an output data, wherein the output data is data that is shifted by certain amount on the source data.

2. The apparatus for switching data in communication system of claim 1, wherein the conversion circuit includes:
    a judgment bit selection component used to provide the judgment bit and to designate the judgment bit of the source data as the correct bit and to designate the judgment bit of the non-source data as the error bit;
    a data conversion component used to provide the source data of the real coding dimension and the non-source data which is a subtraction of the tolerable coding dimension by the real coding dimension; and
    a merging component used to merge the judgment bit, the source data and the non-source data.

3. The apparatus for switching data in communication system of claim 2, wherein the judgment bit selection component is a multiplexer.

4. The apparatus for switching data in communication system of claim 2, wherein data conversion component is a multiplexer.

5. The apparatus for switching data in communication system of claim 1, wherein the shifter circuit includes:
    a shift data component used to shift the converted data by the shift amount so as to generate the shifted data; and
    a data acquisition circuit used to acquire the first data and the second data from the shifted data.

6. The apparatus for switching data in communication system of claim 5, further comprising a multiplexer, which is used to acquire a starting bit of the first data through the most significant bit of the shifted data and the real coding dimension.

7. The apparatus for switching data in communication system of claim 1, wherein the comparison and selection circuit includes:
a comparison circuit used to receive the first data and the second data so as to compare the judgment bits of the first data and the second data and to select and output selected data that is designated as the correct bit; and
a selection data merging component used to merge the selection data sent out from each of the comparator so as to send out the output data.

8. The apparatus for switching data in communication system of claim 7, wherein the comparison circuit includes comparators of the same amount as the tolerable coding dimension so as to receive, starting from the most significant bit of the first data and the second data, respectively the first data and the second data, then each of the comparator, through a comparison of the judgment bits received from the first data and the second data, is to select and output the selected data which is designated as correct bit such that when the comparator judges that all the judgment bits of the first data and the second data are all correct bits, the second data is sent out.

9. The apparatus for switching data in communication system of claim 7, wherein the comparison circuit includes comparators of the same amount as the tolerable coding dimension so as to receive, starting from the least significant bit of the first data and the second data, respectively the first data and the second data; then each of the comparator, through a comparison of the judgment bits received from the first data and the second data, is to select and send out the selected data that is designated as correct bits.

10. The apparatus for switching data in communication system of claim 1, wherein the shifted amount is a default value.

11. A method for switching data in communication system, comprising:
receiving a source data that possesses a real coding dimension;
converting the source data to generate a converted data that possesses a tolerable coding dimension, wherein the real coding dimension is not larger than the tolerable coding dimension, and through the installation of judgment bits, the source data location is designated as a correct bit and the non-source data location is designated as an error bit;
shifting the converted data a shift amount so as to generate a shifted data;
subtracting the most significant bit (MSB) of the shifted data by the bit of the real coding dimension to obtain a first data, and acquiring the real coding dimension starting from the most significant bit of the shifted data toward the direction of the least significant bit (LSB) of the shifted data as a second data;
comparing the judgment bit at each of the corresponding location of the first data and the second data so as to send out the selected data at the location that is designated as the correct bit; and
merging each of the selected data so as to generate an output data.

12. The method for switching data in communication system of claim 11, wherein the shift amount is a default value.

13. The method for switching data in communication system of claim 11, wherein the steps of comparing the judgment bits at the corresponding location of the first data and the second data include:
when all the judgment bits at the corresponding locations of the first data and the second data are all correct bits, the selected data is sent out at the corresponding location of the second data.

14. The method for switching data in communication system of claim 11, wherein the steps of comparing the judgment bits at the corresponding locations of the first data and the second data include:
when not all of the judgment bits of the first data and the second data are correct bits and if the judgment bit of the first data is correct bit, then the selected data is sent out at the corresponding location of the first data; and
if the judgment bit of the second data is correct bit, then the selected data is sent out at the corresponding location of the second data.

* * * * *